United States Patent [19]

Okumura

[11] Patent Number: 5,040,094
[45] Date of Patent: Aug. 13, 1991

[54] 3-TERMINAL CAPACITOR

[75] Inventor: Mitsunao Okumura, Nagaokakyo, Japan

[73] Assignee: Murata Manufacturing Co., Ltd., Japan

[21] Appl. No.: 455,993

[22] Filed: Dec. 22, 1989

[30] Foreign Application Priority Data

Dec. 26, 1988 [JP] Japan ................... 63-330087

[51] Int. Cl.$^5$ .......................... H01G 4/38; H03H 7/09
[52] U.S. Cl. .................................. 361/330; 333/184
[58] Field of Search ............. 29/25.42; 361/306, 307, 361/328, 330; 333/184

[56] References Cited

U.S. PATENT DOCUMENTS

| 2,710,441 | 6/1955 | Heyman | 29/25.42 |
| 3,365,632 | 1/1968 | Grahame | 361/330 |
| 4,847,575 | 7/1989 | Ikeda | 361/303 X |

Primary Examiner—Donald A. Griffin
Attorney, Agent, or Firm—Ostrolenk, Faber, Gerb & Soffen

[57] ABSTRACT

A 3-terminal capacitor includes a wound unit which includes first and second longitudinal insulation sheets having substantially the same length which are laminated. First and second conductors are respectively formed on corresponding main surfaces of the first and second insulation sheets, so that one of the insulation sheets is sandwiched between the two conductors. The first conductor is longitudinally formed with substantially the same length as the first insulation sheet, and the second conductor is formed to be sufficiently shorter than the second insulation sheet. When the first and second insulation sheets are wound together with the first and second conductors to form the wound unit, two first terminals fixed on the first conductor at a predetermined interval and a second terminal fixed on the second conductor are exposed outside the wound unit.

8 Claims, 4 Drawing Sheets

3-TERMINAL CAPACITOR

BACKGROUND OF THE INVENTION

1. Field of the Invention

The present invention relates to a 3-terminal capacitor. More specifically, the present invention relates to a 3-terminal capacitor capable of being used as an electromagnetic interference filter, in which an electrostatic capacitance as well as an inductance is formed between its terminals.

2. Description of the prior art

FIG. 11 is a front view showing a conventional 3-terminal capacitor. On a disc-like ceramic unit 1, electrodes 2 are formed on both sides thereof. As shown in FIG. 11, a U-shaped bent lead-wire 3 is fixed on one electrode 2. A straight lead-wire 4 straight is fixed on the other electrode 2. Then, portions of the ceramic unit 1 and electrodes 2 are molded as shown by the dotted line. Thus, inductances L1 and L2 are formed between terminals 3a and 3b by the lead-wire 3 itself, as shown in FIG. 12. In addition, an electrostatic capacitance C in which the ceramic unit 1 serves as a dielectric member is formed between a connection point of the inductance L1 and L2 and a terminal 4a.

In the 3-terminal capacitor as shown in FIG. 11, the electrostatic capacitance is small such as $C = 0.01$ $\mu F$, for example. In addition, even when the capacitance is formed by a laminated capacitor wherein a plurality of ceramic units are laminated, the electrostatic capacitance becomes no more than $C = 0.1$ $\mu F$, for example.

In addition, the capacitor as shown in FIG. 11, shows a good attenuation characteristic in a high-frequency region more than 50 MHz, but in the case of less than 50 MHz, the attenuation characteristic becomes extremely bad because the inductive reactance of the inductances L1 and L2 becomes small.

SUMMARY OF THE INVENTION

Therefore, a principal object of the present invention is to provide a 3-terminal capacitor in which an electrostatic capacitance is large and an inductance is made large, whereby a good attenuation characteristic can be obtained even in a frequency region less than 50 MHz.

The present invention is a 3-terminal capacitor comprising: a first longitudinal insulation sheet; a first conductor formed on one main surface of the first insulation sheet to be extended in a longitudinal direction thereof; two first terminals fixed on the first conductor so that respective ends thereof are exposed in a width direction of the first insulation sheet; a second insulation sheet laminated on the first insulation sheet; the second conductor formed on one main surface of second insulation sheet to be extended in a longitudinal direction thereof; and a second terminal formed on the second conductor so that an end thereof is exposed in a width direction of the second insulation sheet; wherein the first and second insulation sheets are wound together with the first and second conductors form a wound package and the first and second terminals are exposed to the outside thereof.

Since the second insulation sheet is laminated on the first insulation sheet, the first insulation sheet is sandwiched by the first conductor formed on the first insulation sheet and the second conductor formed on the second insulation sheet. Therefore, an electrostatic capacitance is formed between the first and second conductors, that is, the first and second terminals. In addition, an inductance is formed by the first conductor itself between the first terminals.

In accordance with the present invention, since the first and second insulation sheets are wound together with the first and second conductors, it is possible to obtain a large electrostatic capacitance and to make an inductance very large in comparison with a conventional one, and therefore, it is possible to obtain a good attenuation characteristic in a frequency region less than 50 MHz.

The objects and other objects, features, aspects and advantages of the present invention will become more apparent from the following detailed description of the embodiments of the present invention when taken in conjunction with the accompanying drawings.

DETAILED DESCRIPTION OF THE PREFERRED EMBODIMENTS

Figure 2:
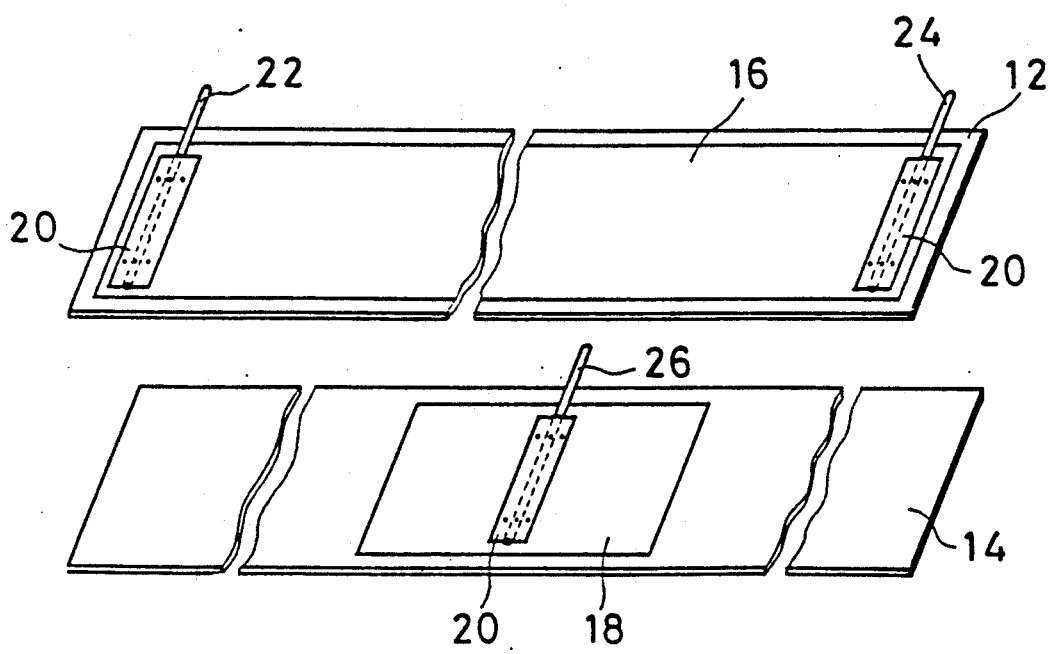
FIG. 2 is a perspective view showing the arrangement of film sheets used in the FIG. 1 embodiment.

With reference to FIG. 2, at first, as insulation materials, longitudinal film sheets 12 and 14 such as polyester films are prepared. On a top surface of the film sheet 12, a conductive foil 16 made of a good conductive metal such as Al or Cu is adhered and extended in a longitudinal direction. On a top surface of the film sheet 14, a conductive foil 18 made of the same good conductive metal is adhered at a center portion thereof. Terminals 22 and 24 are respectively fixed at both ends of the conductive foil 16 by fixing further conductive foils 20 by means of spot-welding. At a center portion of the conductive foil 18, a terminal 26 is fixed by spot-welding a similar conductive foil 20. In addition, FIG. 2, portions where spot-welding is performed are illustrated as black points on the conductive foil 20.

Figure 1A:
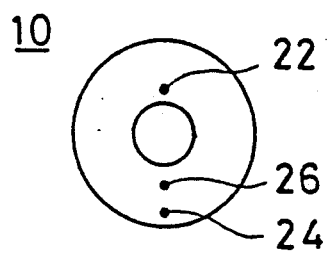
FIG. 1A and FIG. 1B are a top plan view and a side view showing one embodiment in accordance with the present invention.
Figure 1B:
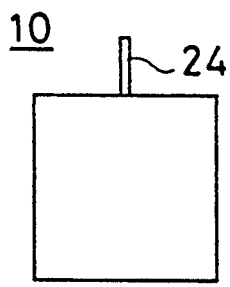

After the completion of fixing of the three terminals 22-26 as shown in FIG. 2, the film sheets 12 and 14 are laminated, and thereafter, the film sheets 12 and 14 are wound in a cylindrical fashion to form a wound package so that the top surface of the film sheet 14 is toward the inside. Thus, a 3-terminal capacitor 10, a top plan view and a side view of which are respectively shown in FIG. 1A and FIG. 1B, is completed.

Figure 3:
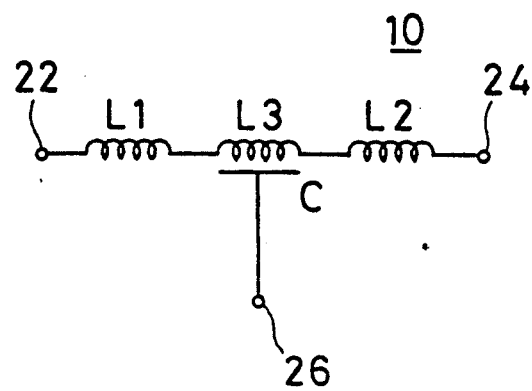
FIG. 3 is an equivalent circuit diagram of the FIG. 1 embodiment.

The 3-terminal capacitor 10 is formed as a cylindrical unit, and the three terminals 22-26 are disposed on a top surface thereof. As shown in FIG. 3, a series connection circuit of inductance L1, L2 and L3 is formed between the terminals 22 and 24 by the conductive foil 16. An electrostatic capacitance C in which the film sheets 12 and 14 are included as dielectric members is formed by the conductive foil 18 and a part of the conductive foil 16 opposite to the conductive foil 18.

In addition, a portion that functions as an electrode for forming the electrostatic capacitance C of the conductive foil 16 simultaneously forms the inductance L3, and therefore, the inductance L3 and the electrostatic capacitance C construct a circuit of a distributed parameters type.

Figure 11:
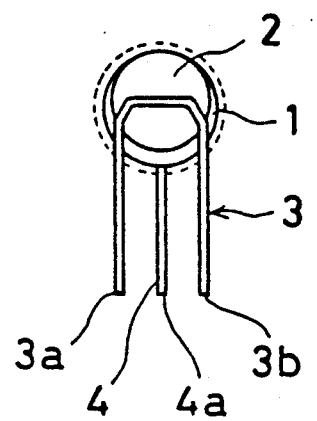
FIG. 11 is a front view showing a conventional capacitor and FIG. 12 is an equivalent circuit diagram thereof.
Figure 12:
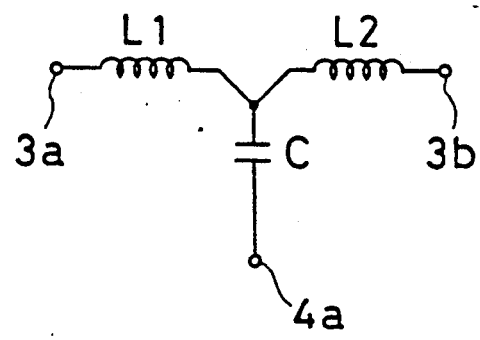

Since the film sheets 12 and 14 are wound to form such a 3-terminal capacitor 10, in comparison with a 3-terminal capacitor in which the disc-like ceramic unit 1 as shown in FIG. 11 serves as a dielectric member, with the same size, it is possible to obtain an electrostatic capacitance of approximately ten times the capacitance of conventional one, for example, $C = 1$ $\mu$F. In addition, in the 3-terminal capacitor 10, it is possible to make the inductance larger than that of the conventional one, so an attenuation characteristic in a frequency region less than 50 MHz is drastically increased.

Figure 4:
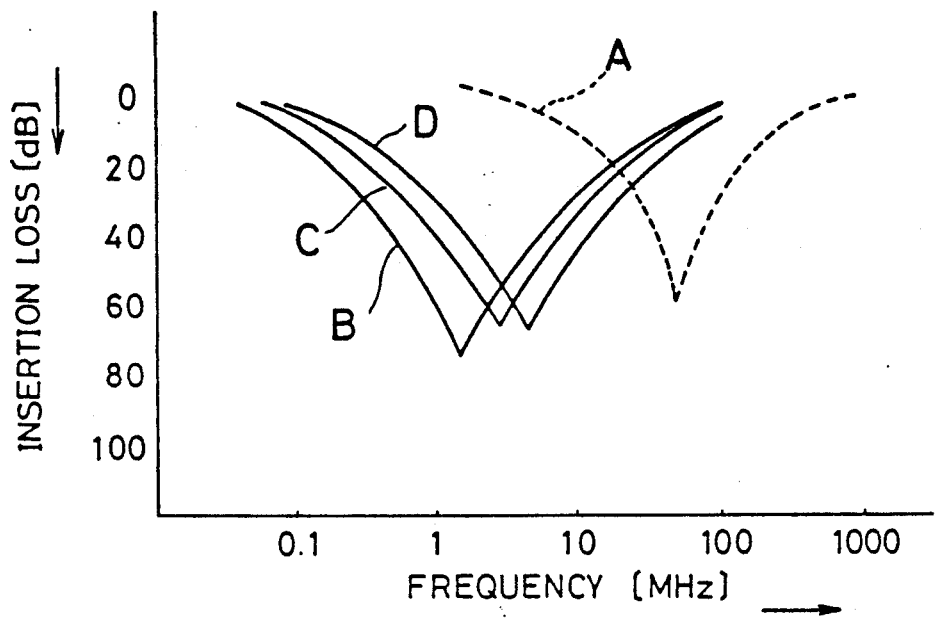
FIG. 4 is a graph showing a comparison of insertion loss with respect to frequency in the FIG. 1 embodiment and in a conventional capacitor.

FIG. 4 shows insertion loss with respect to frequency in a case where a 3-terminal capacitor having an electrostatic capacitance of 2200 pF in accordance with the present invention is compared with a conventional one. In a conventional 3-terminal capacitor shown by a dotted line A, an insertion loss is extremely lowered in a frequency region less than 50 MHz; however, in the 3-terminal capacitor shown by solid lines B, C or D, it is possible to obtain large insertion loss in any cases even if the frequency is approximately 1 MHz.

Since the 3-terminal capacitor 10 is made by a wound unit of the film sheets 14 and 16, it is possible to arbitrarily set values of the electrostatic capacitance and/or inductance, and therefore, it is possible to easily enlarge the applicable range of the capacitor as shown by the lines B-D in FIG. 4.

Figure 5A:
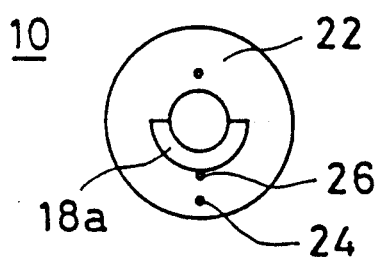
FIG. 5A and FIG. 5B are a top plan view and a side view showing another embodiment in accordance with the present invention.
Figure 5B:
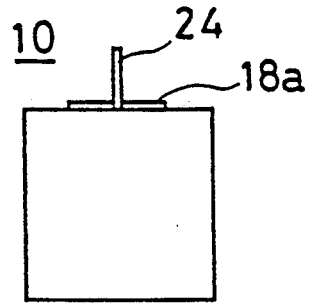
Figure 6:
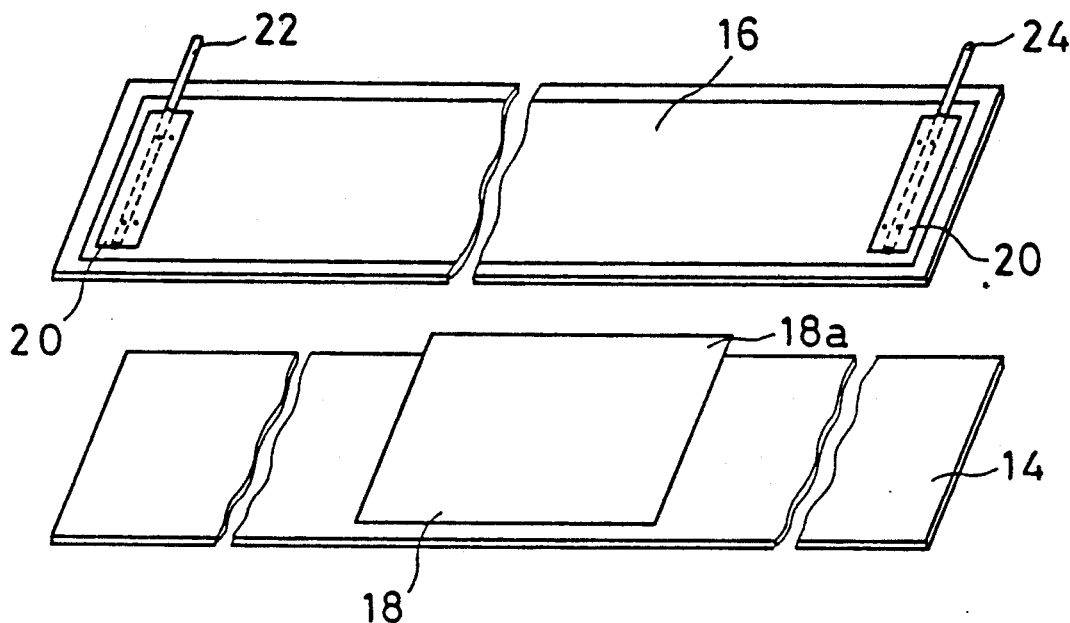
FIG. 6 is a perspective view showing film sheets used in the FIG. 5 embodiment.

FIG. 5A and FIG. 5B are a top plan view and a side view showing another embodiment in accordance with the present invention. In a 3-terminal capacitor 10 in accordance with this embodiment shown, the terminal 26 which is used as a ground terminal is fixed by soldering at a later stage. Therefore, as shown in FIG. 6, no terminal 26 is fixed on the metallic foil 18 adhered on the film sheet 14. Rather, the metallic foil 18 is made larger than the foil shown in FIG. 2, and a projected portion 18a is formed at a side where a terminal 26 is fixed. The projected portion 18a is folded as shown in FIG. 5 after the film sheets 12 and 14 are wound to form a cylindrical unit, and the terminal 26 is fixed by soldering, for example, to the projected portion 18a.

Figure 7:
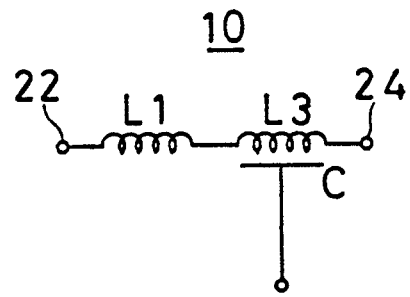
FIG. 7 is an equivalent circuit diagram of the FIG. 5 embodiment.
Figure 8:
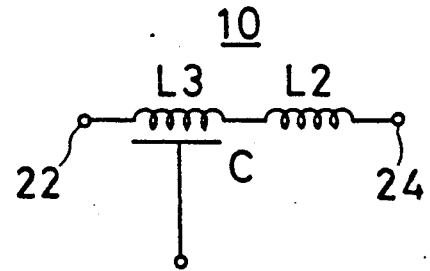
FIG. 8 is another equivalent circuit diagram of the FIG. 5 embodiment.

If the fixing position of the metallic foil 18 is a center portion of the film sheet 14, the equivalent circuit becomes the same as that of FIG. 3. However, if the fixing position of the metallic foil 18 is close to the terminal 24 rather than the center portion, the equivalent circuit becomes as shown in FIG. 7. When the fixing position is close to the terminal 22, the equivalent circuit becomes as shown in FIG. 8. More specifically, in FIG. 3, the inductance L3 and the electrostatic capacitance C of a distributed parameters type are formed at a center portion and the inductances L1 and L2 are respectively formed on both sides thereof. However, in the 3-terminal capacitor 10 shown in FIG. 7 or FIG. 8, the inductance L3 and the electrostatic capacitance C of a distributed parameters type are formed at the side of the terminal 22 or 24, and the inductance L1 or L2 is formed at the side of the remaining terminal. In other words, in accordance with this embodiment shown, it is possible to obtain a circuit configuration of an L-type or an inverted L-type rather than a T-type as in the previous embodiment.

Figure 9A:
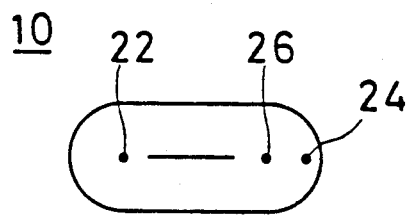
FIG. 9A and FIG. 9B are a top plan view and a side view showing a further embodiment in accordance with the present invention.
Figure 9B:
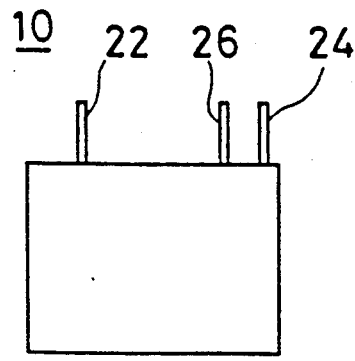

FIG. 9A and FIG. 9B are a top plan view and a side view showing a further embodiment in accordance with the present invention. Although the outer shape is a cylindrical form in the previous embodiments, the outer shape is formed substantially planar in this embodiment shown. Therefore, in a 3-terminal capacitor 10 of this embodiment, after the film sheets 12 and 14 are wound to form a cylindrical unit, the same is pressed to substantially form a plane. Therefore, since the hollow portion of the cylindrical unit is pressed in this embodiment shown, it is possible to miniaturize the 3-terminal capacitor by closing the hollow portion.

Figure 10A:
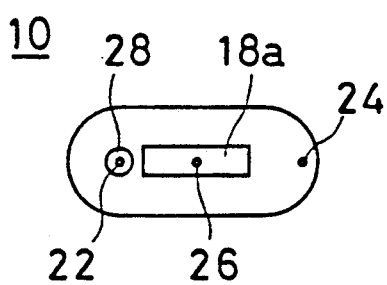
FIG. 10A and FIG. 10B are a top plan view and a side view showing another embodiment in accordance with the present invention.
Figure 10B:
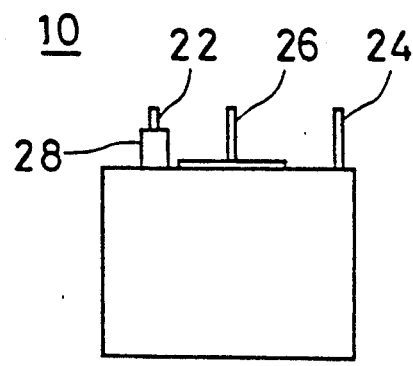

FIG. 10A and FIG. 10B are a top plan view and a side view showing another embodiment in accordance with the present invention. In a 3-terminal capacitor 10 of this embodiment shown, the terminal 26 is fixed to the projected portion 18a by soldering at a later stage. An insulator 28 is formed on the terminal 22 to complete the insulation terminal 22 with respect to the projected portion 18a of the metallic foil 18.

In addition, in the embodiments, if the wound unit is formed as a hollow cylindrical form, it is possible to make the inductance larger by inserting a core made of ferro-magnetic material into the hollow portion.

In addition, although only one sheet of the metallic foil 18 for forming the electrostatic capacitance is formed on the film sheet 14 in FIG. 2 and FIG. 4, if two sheets of metallic foil 18 are adhered so as to form the electrostatic capacitance at two places or positions, a $\pi$-type filter can be constructed, and a ladder-type filter can be also constructed by forming the electrostatic capacitance at a plurality of places or positions.

Furthermore, if a plurality of 3-terminal capacitors 10 in accordance with the above described embodiments are disposed and connected in parallel with each other and thereafter the same are molded, it is possible to form a 3-terminal capacitor block having a large electrostatic capacitance and/or inductance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A 3-terminal capacitor, comprising:
    a first insulation sheet;
    a first conductor formed on one main surface of said first insulation sheet;
    said first insulation sheet being formed as a longitudinal sheet and said first conductor being longitudinally formed with substantially the same length as said first insulation sheet;
    two first terminals fixed on said first conductor at a predetermined interval so that respective ends of said two first terminals are projected outside said first insulation sheet;

a second insulation sheet laminated with said first insulation sheet;

said second insulation sheet being formed as a longitudinal sheet having substantially the same length as said first insulation sheet;

a second conductor formed on one main surface of said second insulation sheet;

a second terminal connected to said second conductor so that an end of said second terminal is projected outside said second insulation sheet;

wherein said first and second insulation sheets are wound together with said first and second conductors to form a wound unit and said first and second terminals are exposed outside said wound unit; and wherein said second conductor is formed to be sufficiently shorter than said second insulation sheet, so that a circuit configuration of said 3-terminal capacitor can be changed by changing a position of said second conductor with respect to said first conductor.

2. A 3-terminal capacitor in accordance with claim 1 wherein said second terminal is fixed to said second conductor so that an end thereof is projected from said second conductor prior to said first and second insulation sheets being wound.

3. A 3-terminal capacitor in accordance with claim 1 wherein said second conductor includes a projected portion which is projected from said second insulation sheet, and said second terminal is fixed to said projected portion, which is exposed outside said wound unit after said first and second insulation sheets are wound.

4. A 3-terminal capacitor, comprising:
a first insulation sheet;
a first conductor formed on one main surface of said first insulation sheet;

two first terminals fixed on said first conductor and spaced by a predetermined interval with respective ends of said two first terminals being projected outside said first insulation sheet;

a second insulation sheet extending in parallel with said first insulation sheet;

a second conductor formed on one main surface of said second insulation sheet;

a second terminal connected to said second conductor with an end of said second terminal being projected outside said second insulation sheet;

said first and second insulation sheets being wound together with said first and second conductors to form a wound unit and said first and second terminals being exposed outside said wound unit; and said second conductor being shorter than said first conductor, and being disposed on said second insulation sheet so as to provide a predetermined circuit configuration of said 3-terminal capacitor, as a function of the position of said second conductor with respect to said first conductor.

5. A 3-terminal capacitor in accordance with claim 4 wherein said first insulation sheet is sandwiched by said first and second conductors.

6. A 3-terminal capacitor in accordance with claim 5, wherein an inductance is provided by said first conductor between said two first terminals, and a capacitance is provided by said first and second conductors at the position of said second conductor with respect to said first conductor.

7. A 3-terminal capacitor in accordance with claim 6, wherein said second conductor is disposed near one of said first terminals, thereby providing an L-type circuit configuration.

8. A 3-terminal capacitor in accordance with claim 6, wherein said second conductor is disposed between said two first terminals, thereby providing a T-type circuit configuration.

* * * * *